US005748521A

United States Patent [19]
Lee

[11] Patent Number: 5,748,521
[45] Date of Patent: May 5, 1998

[54] METAL PLUG CAPACITOR STRUCTURES FOR INTEGRATED CIRCUIT DEVICES AND RELATED METHODS

[75] Inventor: Kyu-pil Lee, Kyungki-do, Rep. of Korea

[73] Assignee: Samsung Electronics Co., Ltd., Suwon, Rep. of Korea

[21] Appl. No.: 746,129

[22] Filed: Nov. 6, 1996

[51] Int. Cl.⁶ .......................... G11C 11/24; H01L 27/108
[52] U.S. Cl. ...................... 365/149; 257/296; 257/306
[58] Field of Search .............................. 365/149, 145; 257/296, 306, 382, 383, 297

[56] References Cited

U.S. PATENT DOCUMENTS

5,359,217  10/1994  Murai ................................. 257/306
5,432,732   7/1995  Ohmi ................................. 365/149
5,438,541   8/1995  Ando ................................. 365/149

Primary Examiner—David C. Nelms
Assistant Examiner—Son Mai
Attorney, Agent, or Firm—Myers Bigel Sibley & Sajovec

[57] ABSTRACT

A capacitor structure includes a substrate and an insulating layer on the substrate. The insulating layer has a contact hole therethrough extending from a surface of the substrate to a surface of the insulating layer opposite the substrate. A metal plug is provided in the contact hole, and a storage electrode is provided on the insulating layer in electrical contact with the metal plug. Accordingly, the storage electrode is electrically connected to the substrate through the metal plug. In particular, the metal plug preferably comprises a metal such as tungsten having a high melting point. Related methods are also disclosed.

13 Claims, 6 Drawing Sheets

METAL PLUG CAPACITOR STRUCTURES FOR INTEGRATED CIRCUIT DEVICES AND RELATED METHODS

FIELD OF THE INVENTION

The present invention relates to the field of microelectronics and more particularly to microelectronic capacitor structures and methods.

BACKGROUND OF THE INVENTION

As integrated circuit devices become more highly integrated, spacing between microelectronic structures is generally reduced and process margins may also be reduced. In particular, the development of dynamic random access memories (DRAM) having giga-bit levels of memory capacity has often forced reductions in spacing between microelectronic structures and process margins to critical levels. The capacitors used in DRAM memory cells, however, must provide a minimum capacitance despite reductions in space available for the capacitors. This minimum capacitance is generally required to provide acceptable data input and output characteristics as well as acceptable refresh characteristics. In response to these reductions in size, capacitor storage electrodes have been developed having three dimensional structures and increased height. Because of the need to maintain a minimum capacitance, reductions in space and process margins may have a critical impact on the design of memory cell capacitors.

Capacitor structures developed to provide an increased ratio of capacitance per unit area include trench capacitors, stack capacitors, and combinations thereof. Stack capacitors have been widely used because these structures can be fabricated relatively easily using existing processing techniques. Furthermore, the stack capacitor structure provides geometrical increases in the effective area of a capacitor. Furthermore, stack capacitors having a capacitor over bit line structure have been proposed.

Figure 1:
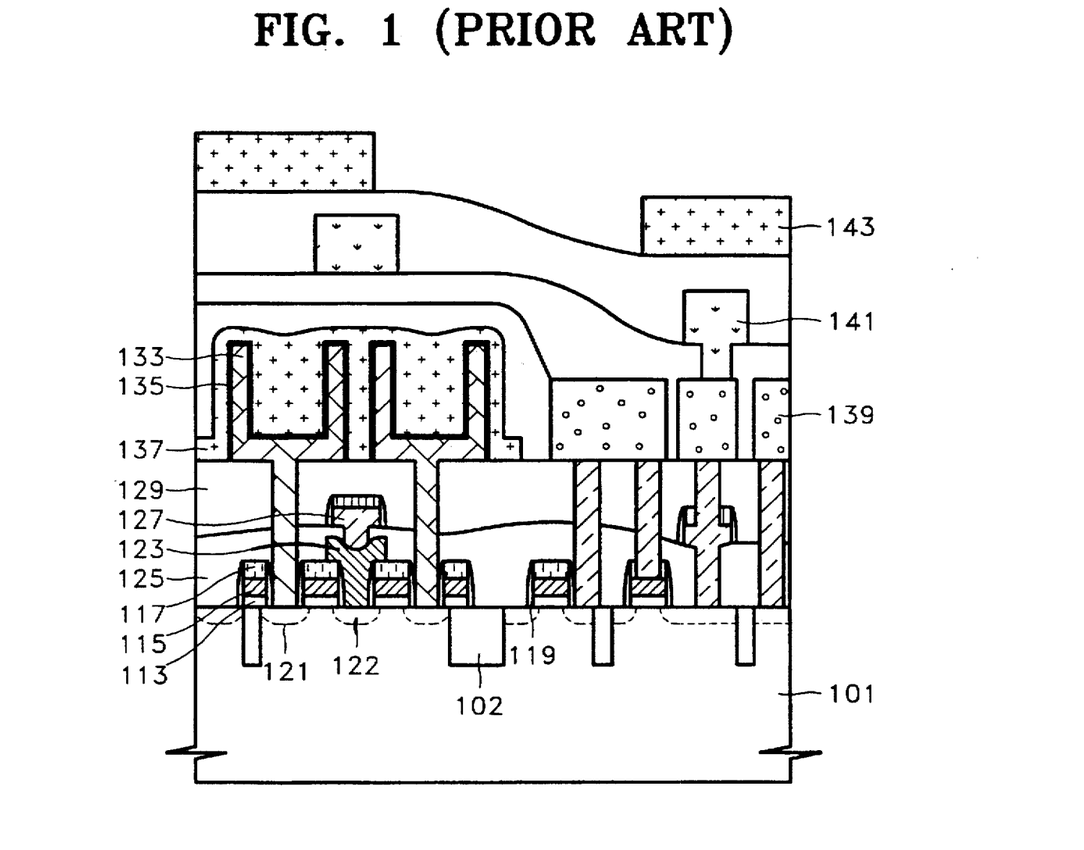
FIG. 1 is a cross-sectional view illustrating an integrated circuit device including a capacitor having a capacitor over bit line structure according to the prior art.

A conventional capacitor having a capacitor over bit line (COB) structure is illustrated in FIG. 1. As shown, a device isolation area 102 is provided between active areas of the semiconductor substrate 101. A transistor includes insulating layers 117 and 113, sidewall spacers 119, conductive layer 115, source 121, and drain 122. As shown, the source and drain are formed on the semiconductor substrate 101. A landing pad 123 is provided on the drain 122, and a first interlayer insulating layer 125 covers the substrate 101, electrodes, and the landing pad 123. A bit line 127 is connected to the drain 122 of the transistor via the landing pad 123.

A second interlayer insulating layer 129 is provided on the upper surface of the bit line 127, and this second interlayer insulating layer 129 can be planarized by conventional methods. A storage electrode 133 formed from doped polysilicon is provided on the second interlayer insulating layer, and the storage electrode 133 is connected to the source 121 of the transistor through a contact hole. The contact hole provides an opening through the first and second interlayer insulating layers 125 and 129 thus allowing electrical connection between the storage electrode 133 and the source 121. The dielectric layer 135 is formed on the storage electrode, and a plate electrode 137 is provided on the dielectric layer 135 opposite the storage electrode 133. The storage electrode 133, dielectric layer 135, and plate electrode 137 thus form a capacitor. The structure can also include interconnection layers 139, 141, and 143.

In the capacitor over bit line structure discussed above, the contact hole is filled with doped polysilicon which is deposited when forming the storage electrode 133. As shown, the resulting pillar of doped polysilicon filling the contact hole has a relatively narrow elongate shape. The resulting resistance of this doped polysilicon pillar between the storage electrode 133 and the transistor source 121 may be sufficiently large that reading and writing data from and to the storage electrode 133 is undesirably delayed. Furthermore, because the doped polysilicon is in direct contact with the semiconductor substrate, dopants from the polysilicon may be diffused by out-diffusion from the bottom of the contact hole to the substrate. Accordingly, the effective length of the transistor channel may be reduced thus degrading the operational characteristics of the transistor. In particular, the on/off characteristics of the memory cell transistor may be adversely affected.

Accordingly, there continues to exist a need in the art for improved capacitor structures and methods for integrated circuit memory devices.

SUMMARY OF THE INVENTION

It is therefore an object of the present invention to provide improved capacitor structures and methods for integrated circuit devices.

It is another object of the present invention to provide connecting structures and methods for integrated circuit capacitors having reduced electrical resistance.

These and other objects are provided according to the present invention by capacitor structures including a substrate, and an insulating layer on the substrate wherein the insulating layer has a contact hole therethrough extending from a surface of the substrate to a surface of the insulating layer opposite the substrate. A storage electrode is provided on the insulating layer, and a metal plug in the contact hole provides electrical connection between the substrate and the storage electrode. The metal plug can thus provide a low resistance electrical connection between the substrate and the storage electrode.

The metal plug preferably comprises a metal having a high melting point such as tungsten. In addition, the metal plug can include a conductive adhesion portion adjacent the substrate, and this conductive adhesion portion can include a layer of titanium on the substrate and a layer of titanium nitride on the layer of titanium. This conductive adhesion layer thus facilitates adhesion of the metal plug to the semiconductor substrate.

The capacitor structure can also include a transistor having a source in the substrate wherein the metal plug is electrically connected to the source of the transistor. In addition, the capacitor structure can include a dielectric layer on the storage electrode, and a plate electrode on the dielectric layer thus completing the capacitor. Furthermore, the storage electrode can be formed from doped polysilicon. Accordingly, the capacitor structure of the present invention can be used to provide a low resistance electrical connection between a memory cell transistor and storage electrode of a memory cell capacitor thus reducing the time required to read and write data from and to the storage capacitor.

In particular, an integrated circuit memory device according to the present invention includes a substrate and a transistor having a source and a drain in the substrate. An insulating layer on the substrate has a contact hole therethrough extending from the source on the substrate to a surface of the insulating layer opposite the substrate. A storage electrode on the insulating layer is electrically connected to the transistor source through a metal plug in the contact hole. Furthermore, a bit line is electrically connected to the drain of the transistor on the substrate.

According to another aspect of the present invention, a method for forming a capacitor includes the steps of forming an insulating layer on a substrate, and forming a contact hole in the insulating layer extending from a surface of the substrate to a surface of the insulating layer opposite the substrate. A metal plug is formed in the contact hole, and a storage electrode is formed on the insulating layer and in contact with the metal plug so that the storage electrode is electrically connected to the substrate through the metal plug.

More particularly, the step of forming the metal plug can include the steps of forming a layer of a metal on the insulating layer wherein the metal fills the contact hole in the insulating layer. Portions of the layer of metal on the insulating layer are then removed while maintaining the metal in the contact hole. The metal on the insulating layer can be removed by chemical mechanical polishing. In addition, the step of forming the insulating layer can be followed by the step of planarizing the insulating layer by chemical mechanical polishing.

According to the methods and structures of the present invention, a low resistance electrical connection can be provided between a capacitor storage electrode and the substrate. In particular, a metal plug provides an electrical connection having a significantly lower electrical resistance than that of a polysilicon pillar according to the prior art. Accordingly, the methods and structures of the present invention can be used to provide highly integrated memory cells which allow data to be written to and read from memory cell capacitors relatively quickly.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 2:
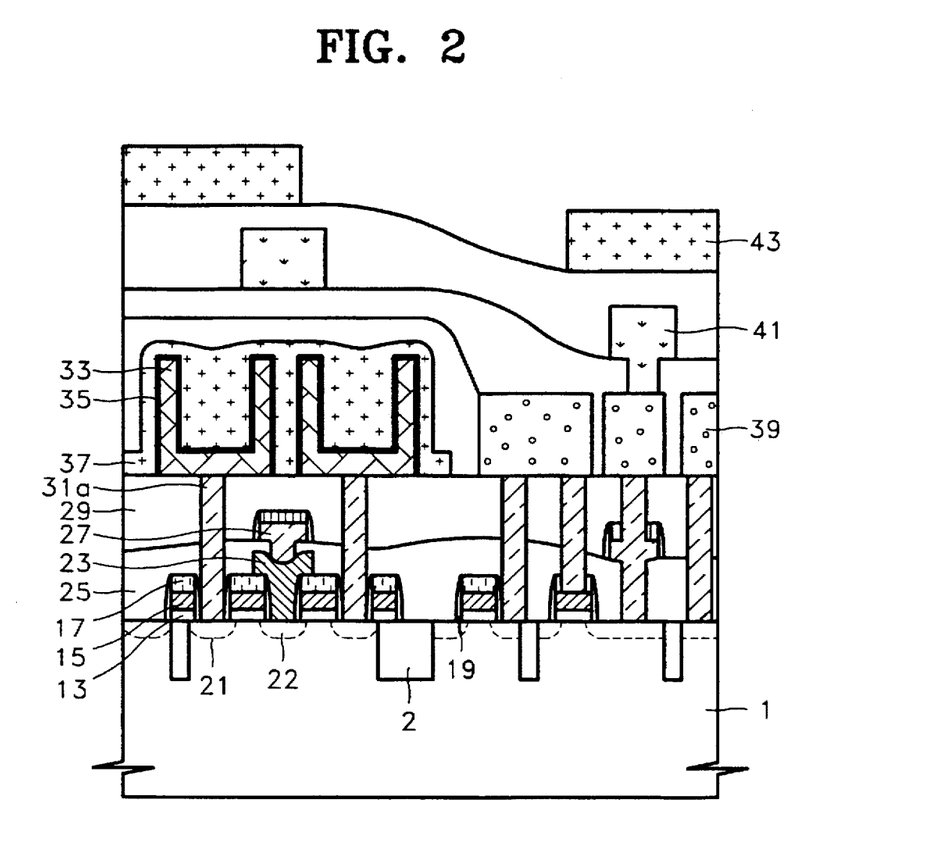
FIG. 2 is a cross-sectional view illustrating an integrated circuit device including a capacitor according to the present invention.

An integrated circuit device including a capacitor according to the present invention is illustrated in FIG. 2. This integrated circuit device includes a device isolation area 2 between active areas of the semiconductor substrate 1. A transistor on the substrate includes insulating layers 13 and 17, a conductive layer 15, sidewall spacers 19, source 21, and drain 22 formed on the semiconductor substrate 1. A first interlayer insulating layer 25 covers the transistor, and a landing pad 23 provides increased process tolerance when forming a contact hole for the bit line 27. The bit line 27 is connected to the transistor drain 22 via the landing pad 23.

A second interlayer insulating layer 29 is formed on the bit line 27, and this second interlayer insulating layer can be planarized. A metal plug 31a is connected to the transistor source 21 of a lower memory cell transistor through a contact hole. As shown, this contact hole penetrates the first and second interlayer insulating layers 25 and 29, and the storage electrode is formed on the second interlayer insulating layer 29 over the contact hole. Accordingly, the storage electrode 33 is connected to the source 21 via the metal plug 31a. A dielectric layer 35 is formed on the storage electrode 33, and a plate electrode 37 is formed on the dielectric layer 35. Accordingly, the storage electrode 33, the dielectric layer 35, and the plate electrode 37 together provide a memory cell capacitor. The integrated circuit device also includes interconnection layers 41 and 43.

In contrast with the prior art structure of FIG. 1, a metal plug 31a provides an electrical connection between the storage electrode 33 and the transistor source 21 on the substrate. As before, the storage electrode 33 is formed from a conductive material such as doped polysilicon, and the structure of this storage electrode determines the effective area of the capacitor. According to the present invention, however, electrical connection between the storage electrode and the transistor source 21 is provided via a metal plug 31a in the contact hole through the interlayer insulating layers 25 and 29. The metal plug 31a is preferably formed from a metal having a high melting point. For example, a metal such as tungsten having a melting point of approximately 3,422° C. or higher can be used. Furthermore, the metal plug can have a sandwiched structure including a conductive adhesion layer.

Figure 3A:
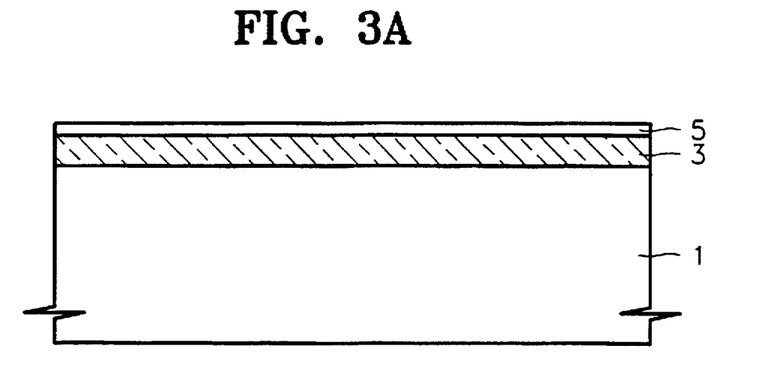
FIGS. 3A–3K are cross-sectional views illustrating steps of a method for forming an integrated circuit device including a capacitor according to the present invention.

A method for manufacturing an integrated circuit memory device including a capacitor according to the present invention will now be discussed with reference to FIGS. 3A–3K. As shown in FIG. 3A, the trench mask layers 3 and 5 are formed on the semiconductor substrate 1. The trench mask layers 3 and 5 are first and second insulating layers having different etching characteristics. For example, the trench mask layers can be a nitride layer and an oxide layer respectively. In particular, the first insulating layer 3 is used as a chemical mechanical polishing (CMP) stop layer during a subsequent CMP step.

Figure 3B:
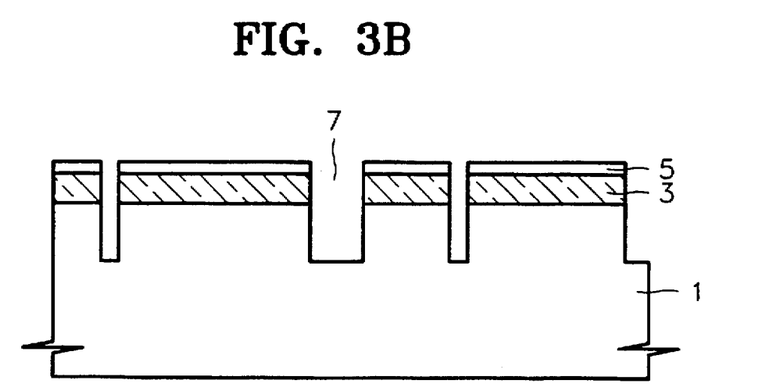
Figure 3C:
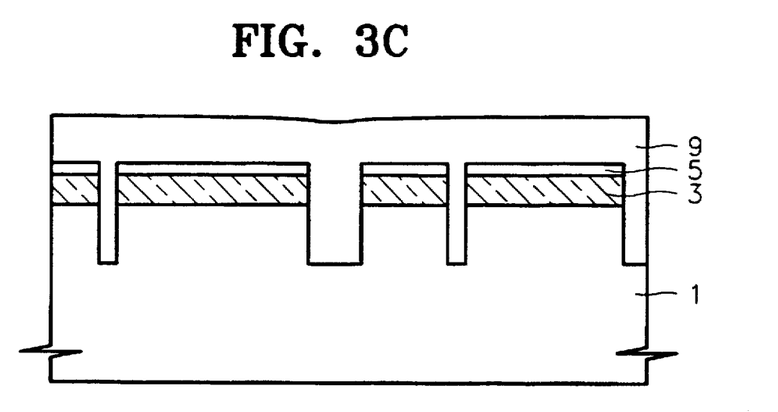

A photoresist pattern is formed on the second insulating film 5 and patterned using photolithographic techniques. The semiconductor substrate 1, and the first and second insulating layers 3 and 5 are then etched using the patterned photoresist layer as a mask thus forming the shallow trench 7 as shown in FIG. 3B. The trench 7 is filled with insulating material to provide a device isolation area. As shown in FIG. 3C, a third insulating layer 9 is formed on the entire surface of the substrate to fill the trench 7.

Figure 3D:
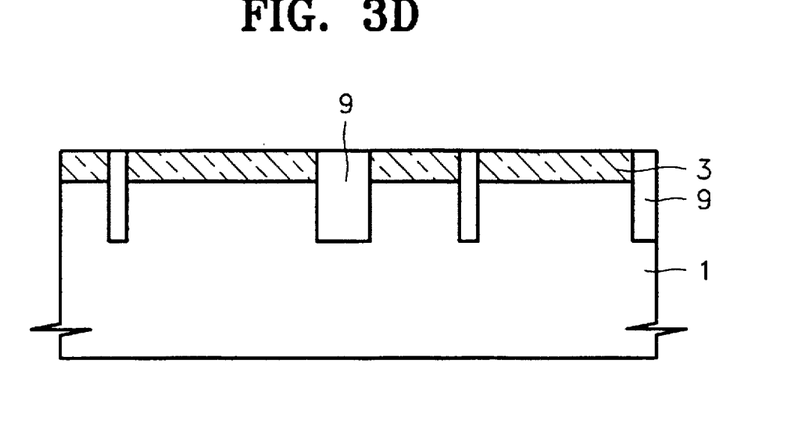

Portions of the third insulating layer 9 outside the trench 7 can be removed as shown in FIG. 3D. In particular, the third insulating layer 9 and the second insulating layer 5 are etched leaving only portions of the third insulating layer 9 in the trench 7. This etching step can be accomplished using chemical mechanical polishing (CMP) or etch-back techniques. Accordingly, only the first insulating layer 3 and buried portions of the third insulating layer 9 remain on the semiconductor substrate 1.

The first insulating layer 3 is then selectively removed while maintaining the buried portions of the third insulating layer 9 in the trench. The buried portions of the third insulating layer thus provide the device isolation oxide pattern 2 shown in FIG. 3E. An ion implantation 11 is then performed to adjust a threshold voltage for the transistor.

Figure 3E:
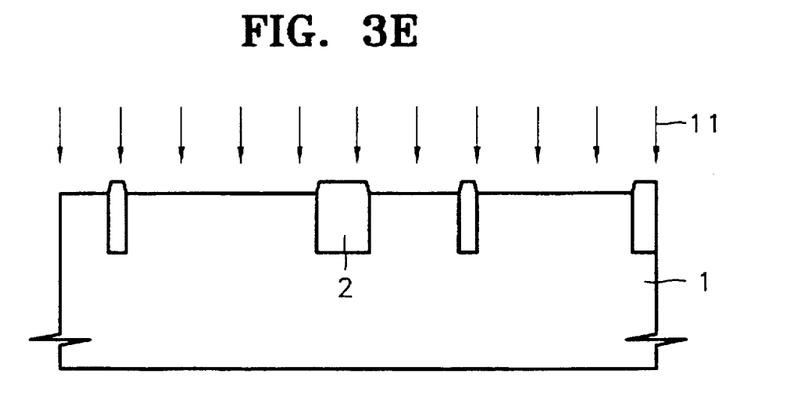

This ion implantation is performed on the active portions of the semiconductor substrate.

Figure 3F:
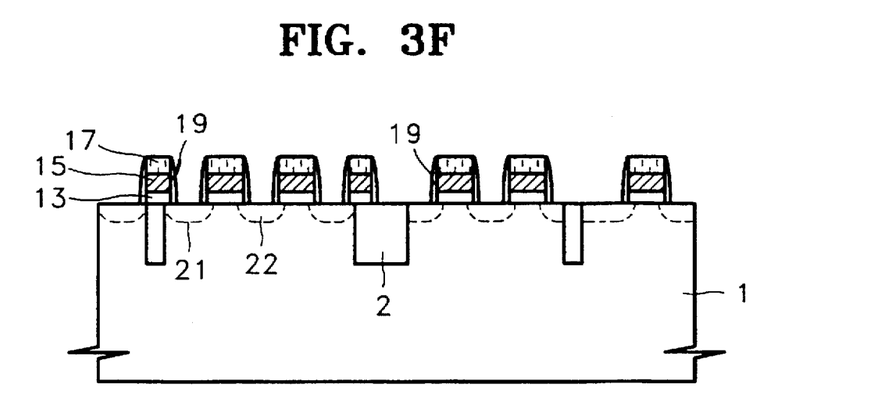

Transistors are then formed as shown in FIG. 3F. Each of the transistors includes a gate including insulating layers 13 and 17, conductive layer 15, sidewall spacers 19, source 21, and drain 22. The conductive layer 15 can be a polycide layer formed by sequentially depositing a doped polysilicon layer and a silicide layer. Alternately, the insulating layer 17 can be omitted.

Figure 3G:
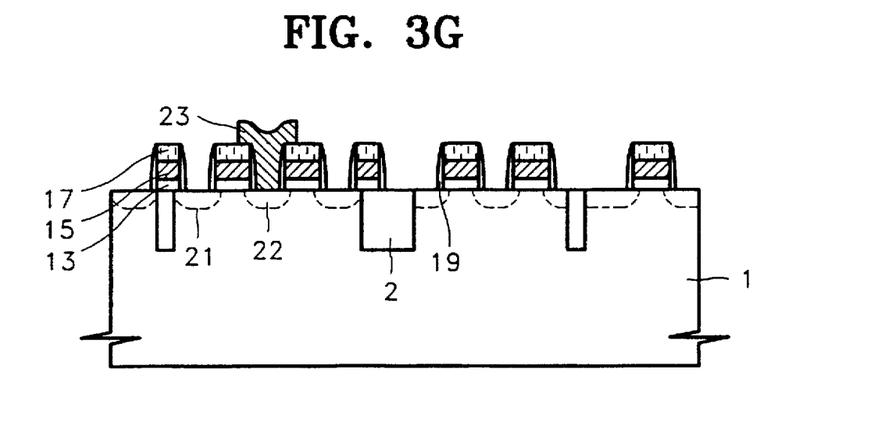

A landing pad 23 is then provided as shown in FIG. 3G. In particular, a conductive layer is deposited on the surface of the semiconductor substrate 1. This conductive layer is then etched using photolithographic techniques thereby forming the landing pad 23. A landing pad 23 provides an increased process margin when forming a contact hole for a bit line. If sufficient process margins are available, the landing pad 23 can be omitted.

Figure 3H:
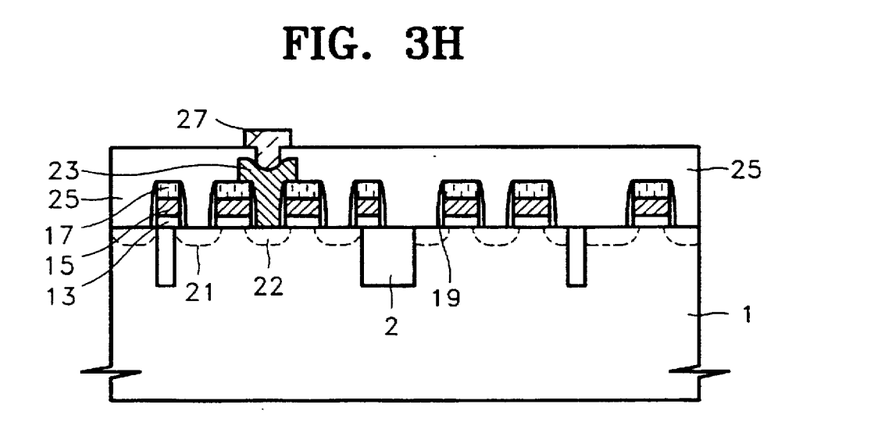

A bit line 27 is connected to the landing pad 23 as shown in FIG. 3H. A first interlayer insulating layer 25 is deposited on the surface of the substrate covering the electrodes and the landing pad 23. This insulating layer 25 is then planarized, and a bit line contact hole is formed therethrough using photolithographic techniques. A conductive layer is then deposited on the interlayer insulating layer 25 filling the contact hole as discussed above. This conductive layer is then patterned to provide the bit line 27. Alternately, the contact hole can extend to the substrate if no landing pad is provided so that the conductive layer formed in the contact hole contacts the substrate directly.

Figure 3I:
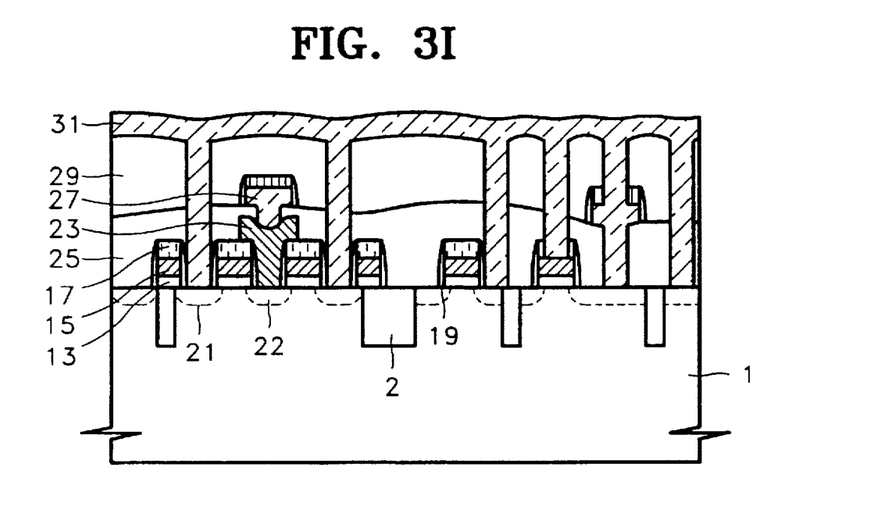

A second interlayer insulating layer 29 and a metal layer 31 are formed as shown in FIG. 3I. The second interlayer insulating layer 29 is deposited on the surface of the first interlayer insulating layer 25, and the second interlayer insulating layer 29 is then planarized. A contact hole is formed in the first and second interlayer insulating layers 25 and 29 using photolithographic techniques. This contact hole will be used to provide an electrical connection between the transistor source 21 and the capacitor storage electrode. A metal layer 31 is then deposited on the surface of the second interlayer insulating layer 29, and this metal layer 31 fills the contact hole. The step of depositing the metal layer 31 can alternately be preceded by the step of forming a conductive adhesion layer in the contact hole adjacent the substrate. This conductive adhesion layer can facilitate the adhesion of the metal layer to the substrate. More particularly, the conductive adhesion layer can be formed by sequentially depositing titanium and titanium nitride. The metal layer 31 is preferably formed from a metal having a relatively high melting point allowing the metal layer to endure subsequent thermal processing. In particular, the metal layer may be a layer of tungsten having a melting point of 3,422° C.

Figure 3J:
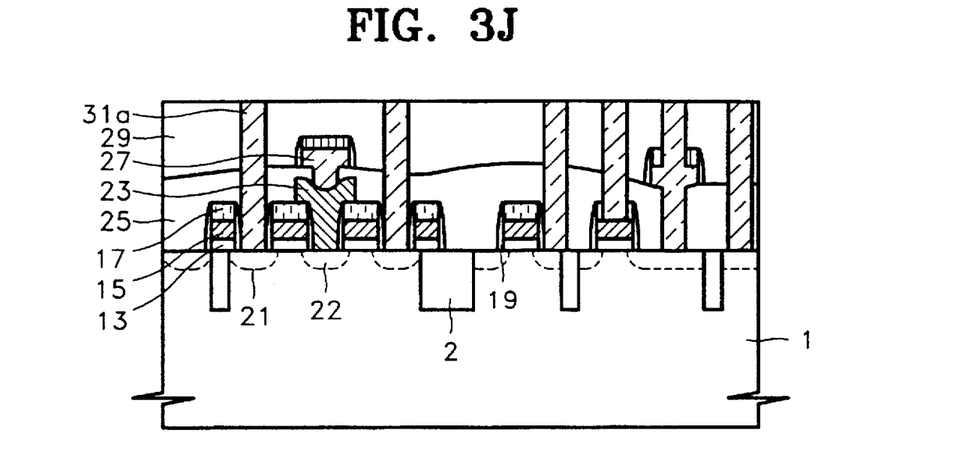

The metal layer 31 is then etched back to leave the metal plug 31a in the contact hole, as shown in FIG. 3J. In particular, the metal layer can be etched back using a chemical mechanical polishing technique. Accordingly, the metal layer is removed from the surface of the second interlayer insulating layer 29 and only the metal plug 31a remains.

Figure 3K:
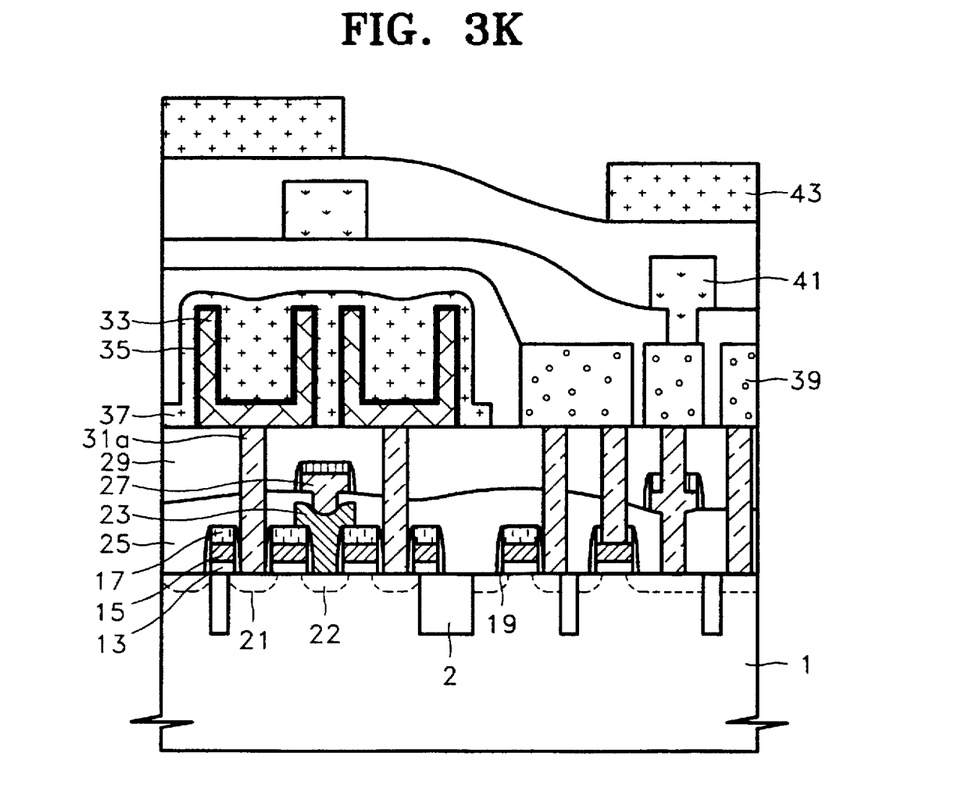

A capacitor storage electrode 33 is then formed on the second interlayer insulating layer 29 adjacent the metal plug 31a as shown in FIG. 3K. The structure of this storage electrode 33 determines the effective area of the capacitor. In particular, a conductive layer is deposited and then etched using photolithographic techniques to form the storage electrode 33. The conductive layer used to form the storage electrode 33 can be a layer of a doped polysilicon. By providing an electrical connection between the storage electrode 33 and the metal plug 31a, the storage electrode is electrically connected to the transistor source 21. A dielectric layer 35 and a plate electrode 37 are formed on the storage electrode 33 thereby completing the capacitor for the integrated circuit device. The integrated circuit device may also include interconnection layers 39, 41, and 43.

Unlike conventional capacitor structures wherein a storage electrode is connected to a transistor source through a pillar of polysilicon, the capacitor structure of the present invention provides electrical connection between the storage electrode and the transistor source through a metal plug 31a. Accordingly, the metal plug of the present invention provides an electrical connection between the storage electrode and the transistor source having reduced electrical resistance. In other words, the metal plug can have a lower electrical resistance than the polysilicon pillar of the prior art. Accordingly, the speed of data read and write operations from and to the capacitor storage electrode can be increased. Furthermore, because dopants are not required to reduce the resistivity of the metal plug, the undesired diffusion of dopants into the substrate is reduced when using a conductive metal plug in the place of a doped polysilicon pillar. The out-diffusion of dopants into the substrate is thus reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A capacitor structure comprising:
    a substrate;
    an insulating layer on said substrate, said insulating layer having a contact hole therethrough extending from a surface of said substrate to a surface of said insulating layer opposite said substrate;
    a metal plug in said contact hole wherein said metal plug comprises a conductive adhesion portion of a first material adjacent said substrate and a body portion of a second material on said conductive adhesion portion opposite said substrate wherein said first and second materials are different; and
    a storage electrode on said insulating layer and in electrical contact with said metal plug so that said storage electrode is electrically connected to said substrate through said metal plug.

2. A capacitor structure according to claim 1 wherein said body portion of said metal plug comprises tungsten.

3. A capacitor structure according to claim 1 wherein said conductive adhesion portion comprises titanium and titanium nitride.

4. A capacitor structure according to claim 1 further comprising a transistor having a source in said substrate wherein said metal plug is electrically connected to said source.

5. A capacitor structure according to claim 1 wherein said metal plug comprises a metal having a melting point of at least about 3,422° C.

6. A capacitor structure according to claim 1 further comprising:
    a transistor including a source and a drain in said substrate wherein said contact hole extends from said source in said substrate to said surface of said insulating layer opposite said substrate so that said storage electrode is electrically connected to said source through said metal plug; and a bit line electrically connected to said drain of said transistor.

7. A capacitor structure according to claim 6 wherein said transistor comprises a memory cell transistor.

8. A capacitor structure according to claim 1 wherein said conductive adhesion portion comprises a material chosen from the group consisting of titanium and titanium nitride.

9. An integrated circuit memory device comprising:

a substrate;

a transistor including a source and a drain in said substrate;

an insulating layer on said substrate, said insulating layer having a contact hole therethrough extending from said source on said substrate to a surface of said insulting layer opposite said substrate;

a metal plug in said contact hole wherein said metal plug comprises a conductive adhesion portion of a first material adjacent said source and a body portion of a second material on said conductive adhesion portion opposite said source wherein said first and second materials are different;

a storage electrode on said insulating layer and in electrical contact with said metal plug so that said storage electrode is electrically connected to said source through said metal plug; and a bit line electrically connected to said drain of said transistor.

10. An integrated circuit memory device according to claim 9 wherein said body portion of said metal plug comprises tungsten.

11. An integrated circuit memory device according to claim 9 wherein said conductive adhesion portion comprises titanium and titanium nitride.

12. An integrated circuit memory device according to claim 9 wherein said metal plug comprises a metal having a melting temperature of at least about 3,422° C.

13. An integrated circuit memory device according to claim 9 wherein said conductive adhesion portion comprises a material chosen from the group consisting of titanium and titanium nitride.

* * * * *